United States Patent [19]

Schlegel et al.

[11] 4,313,128
[45] Jan. 26, 1982

[54] COMPRESSION BONDED ELECTRONIC DEVICE COMPRISING A PLURALITY OF DISCRETE SEMICONDUCTOR DEVICES

[75] Inventors: Earl S. Schlegel, Plum Borough; Derrick J. Page, Export, both of Pa.

[73] Assignee: Westinghouse Electric Corp., Pittsburgh, Pa.

[21] Appl. No.: 37,090

[22] Filed: May 8, 1979

[51] Int. Cl.³ .............. H01L 23/02; H01L 23/12; H01L 23/42
[52] U.S. Cl. ........................ 357/79; 357/74; 357/75
[58] Field of Search .............. 357/74, 75, 76, 79

[56] References Cited

U.S. PATENT DOCUMENTS

| | | | |
|---|---|---|---|
| 3,471,757 | 10/1969 | Sias | 357/79 |
| 3,483,444 | 12/1969 | Parrish | 357/75 |
| 3,486,103 | 12/1969 | Boksjo | 357/75 |
| 3,532,942 | 10/1970 | Boyer | 357/79 |
| 3,644,797 | 2/1972 | Carter | 357/79 |
| 3,723,836 | 3/1973 | Shekerjian | 357/75 |
| 3,902,774 | 9/1975 | Gronholm | 357/79 |
| 3,916,435 | 10/1975 | Camplin et al. | 357/79 |
| 4,035,831 | 7/1977 | Saeki | 357/79 |
| 4,128,870 | 12/1978 | Knobloch et al. | 357/79 |
| 4,160,992 | 7/1979 | Adlerstein | 357/75 |
| 4,224,663 | 9/1980 | Maiese et al. | 357/79 |

FOREIGN PATENT DOCUMENTS 2728313  1/1979  Fed. Rep. of Germany ........ 357/79

Primary Examiner—Andrew J. James
Attorney, Agent, or Firm—C. L. Menzemer

[57] ABSTRACT

An electronic device is provided comprising two or more discrete semiconductor devices in an electrical circuit relationship, hermetically sealed within a single case member. Electrical and thermal conductivity between the semiconductor devices and electrodes on the case member is established and maintained by the application of a compressive force to the case member. The compressive force applied to the case member is distributed to the individual semiconductor devices sealed within the case member.

8 Claims, 12 Drawing Figures

4,313,128

COMPRESSION BONDED ELECTRONIC DEVICE COMPRISING A PLURALITY OF DISCRETE SEMICONDUCTOR DEVICES

BACKGROUND OF THE INVENTION

1. Field of the Invention

The present invention is in the semiconductor field generally and in particular, is directed to a plurality of discrete semiconductor devices sealed within a single case member.

2. Description of the Prior Art

Two discrete semiconductor devices, connected in an electrical circuit relationship, have in the past, been sealed within a single case member. A particular example of such electronic device is a Darlington Circuit consisting of two discrete, but electrically matched transistors contained within a single case member.

However, in these prior art Darlington Circuits the transistors were soldered or brazed to electrodes comprising a part of the case member.

In addition, electrical circuit relationships between the two discrete devices was established in these prior art devices by the use of wire interconnects.

More recently, a discrete by-pass diode has been incorporated in a case member with a discrete thyristor. In this prior art embodiment too, wire interconnects have been used to establish an electrical circuit relationship between the two discrete semiconductor devices or, in some embodiments, the diode has been soldered or brazed directly to an electrode of the thyristor.

Compression bonded semiconductor encapsulated devices, referred to as CBE devices are well known. However, all previous CBE's have included only one discrete semiconductor device within the case.

SUMMARY OF THE INVENTION

The present invention is directed to an electronic device comprising a case member, said case member comprising a bottom member, a top member and a side member, said side member being joined to and extending between said bottom and said top member, said bottom member, top member and side member forming a chamber, means associated with a surface of said bottom member, within said chamber, for positioning a plurality of semiconductor devices upon said surface, a plurality of semiconductor devices disposed in predetermined positions upon the surface of said bottom member within said chamber, and means comprising a part of said case member for distributing a compressive force, applied to said case member, to said plurality of semiconductor devices, whereby said semiconductor devices are held in an electrical and thermal conductive relationship with portions of said case member and in an electrical circuit relationship with each other when the compressive force is applied to said case member.

DESCRIPTION OF THE DRAWINGS

For a better understanding of the nature of the present invention, reference should be had to the following detailed description and drawing in which.

DESCRIPTION OF PREFERRED EMBODIMENTS

Figure 1:
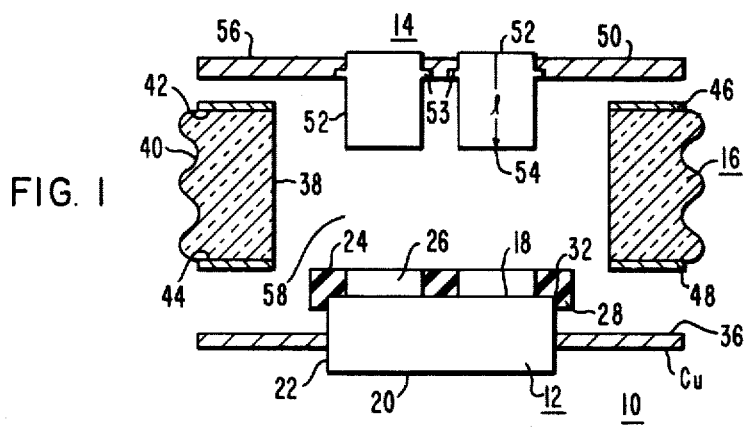
FIG. 1 is an exploded view of a case member suitable for use in accordance with the teaching of this invention.

With reference to FIG. 1, there is shown an exploded view of a case member 10 suitable for use in accordance with the teachings of this invention.

The case 10 consists of a bottom member 12, a top member 14 and a side member 16.

The bottom member 12 is comprised of a suitable electrically and thermally conductive metal as for example copper.

The bottom member 12 has a top surface 18, a bottom surface 20 and an edge portion 22.

The top surface 18, of bottom member 12, has means 24 disposed thereon for positioning a plurality of semiconductor devices in predetermined positions on the top surface 18.

In FIG. 1, the means 24 comprises an electrically insulating member with a plurality of apertures 26 therein which extend entirely through the member. The apertures correspond to the predetermined positions at which it is desired to position semiconductor devices.

The member comprising means 24 has a shoulder 28 which fits over edge 32 of member 12 to retain the member comprising means 24 in position.

The member comprising means 24 may be comprised of any suitable electrically insulating material, as for example, but not limited to, silicone rubber, polytetra fluoroethylene, polytrifluoromonochloroethylene and ceramic compositions.

Figure 2:
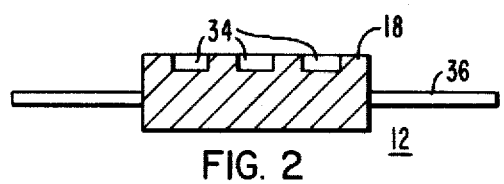
FIG. 2 is a side view, in cross-section, of a modified bottom member suitable for use in the case member of FIG. 1.

With reference to FIG. 2, the means 24 may comprise cavities 34 machined or stamped in the top surface 18 of bottom member 12.

With reference to both FIGS. 1 and 2, the bottom member 12 of case member 10 has a flange portion 36 extending radially therefrom to facilitate joining to side member 16 of the case member 10.

With reference to FIG. 1, side member 16 of case member 10 is comprised of an electrically insulating ceramic. The side member 16 is generally cylindrical in physical shape. Inner wall 38 of side member 16 is usually smooth relative to outer wall 40 which has a serpentine configuration. The serpentine configuration increases the distance any leakage current flowing between top member 14 and bottom member 12 must travel.

Top surface 42 and bottom surface 44 of side member 16 have a metalized layer 46 and 48 respectively disposed thereon to facilitate joining the side member 16 to top member 14 and bottom member 12. The metalized layer typically is comprised of a nickel plated sintered manganese paste.

Top member 14 of case member 10 is comprised of a plate portion 50 and pole portions 52.

The plate portion 50 is comprised of a suitable electrically conductive metal as, for example, copper. A ferrous base alloy having a nominal composition, by weight, 54% Fe, 28% Ni, 18% Co and sold under the Trademark KOVAR is also satisfactory. Typically, the plate portion has a thickness of approximately 20 mils.

The pole portions 52 are typically of copper and extend entirely through the plate portion 50 of top member 14.

The pole portion 52 is provided with a shoulder 53 to facilitate soldering, brazing or welding the pole portion 52 to the plate portion 50.

If desired, primarily for reasons of electrical circuit relationship, the pole portion 52 can be joined to, but electrically isolated from, the plate portion 50 by the use of a glass sleeve.

An example of a suitable glass is one having a nominal composition, by weight:

| Constituent | Percentage |
| --- | --- |
| $SiO_2$ | 32–40 |
| $B_2O_3$ | 12–23 |
| PbO | 42–48 |
| $Al_2O_3$ | 2–6 |

The number of pole portions 52 contained in top member 14 will depend on the number of semiconductor devices to be enclosed within the case member 10, there being one pole portion for each semiconductor device.

The pole portion is generally circular in cross-sectional area and will have a cross-sectional area, at least at surface 54, so as to be co-extensive with a metal electrode of a semiconductor device enclosed within the case 10. This feature will be discussed in more detail hereinafter. The length "l" of the pole portion is dependent on the thickness of the semiconductor, enclosed within the case, in which it is in contact.

The case member 10 is formed by soldering, brazing, or welding the bottom surface 44, with its metalized layer 48, of side member 16 to the flange portion 36 of bottom member 12 and top surface 42, with its metalized layer 46, to outer portion 56 of plate portion 50 of top member 14.

The joining of the bottom member 12, top member 14 and side member 16 forms a hermetically sealed chamber 58.

Figure 3:
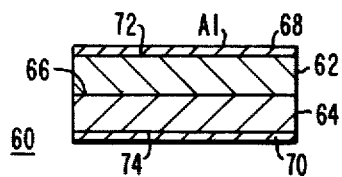
FIGS. 3, 4 and 5 are side views of a semiconductor device suitable for use in accordance with the teachings of this invention.

With reference to FIG. 3, there is shown a typical diode or rectifier 60 suitable for use in accordance with the teachings of this invention.

The diode 60 consisting of a body of semiconductor material, as for example silicon, having a first region 62 of a first-type of conductivity, a second region 64 of a second-type conductivity with a p-n junction 66 at the interface between regions 62 and 64.

Metallic electrodes 68 and 70 respectively, of for example molybdenum, are affixed to surfaces 72 and 74 respectively of the diode 60.

In practice, one electrode may be of one metal and the other of another metal. For example, electrode 72 may be of aluminum and electrode 74 of molybdenum.

Figure 4:
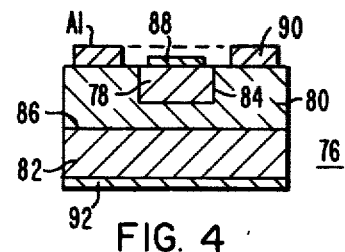

With reference to FIG. 4, there is shown a typical transistor 76 suitable for use in accordance with the teachings of this invention.

The transistor 76 consists of a body of semiconductor material, as for example silicon, having an emitter region 78, a base region 80, and a collector region 82. The emitter region 78 and collector region 82 are both of a first-type of conductivity and the base region 80 is of a second-type of conductivity. There is a first p-n junction 84 between the emitter region 78 and the base region 80 and a second p-n junction 86 between base region 80 and collector region 82.

Metal electrodes 88, 90 and 92 consisting of, for example, molybdenum or aluminum, are affixed to the emitter, base and collector regions respectively. As shown in FIG. 4, the base region electrode 90 is frequently of an annular configuration in this type of transistor.

Figure 5:
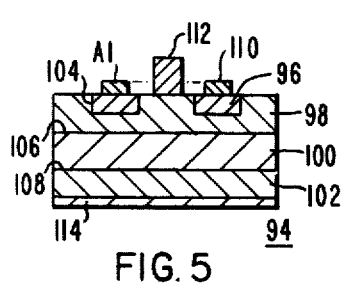

With reference to FIG. 5, there is shown as four region, switching type semiconductor device 94 of the type known as SCR's and thyristors suitable for use in accordance with the teachings of this invention.

The device 94 is comprised of a body of semiconductor material, for example silicon, having four regions 96, 98, 100 and 102 of alternating first-type and second-type conductivity. The p-n junctions 104, 106 and 108 exist between regions 96 and 98, regions 98 and 100 and regions 100 and 102 respectively.

Typically, in devices of this type, regions 96 and 102 are emitter regions, cathode and anode, and regions 98 and 100 are base regions, cathode and anode.

Metal electrodes 110, 112 and 114 are affixed to regions 96, 98 and 102 respectively while region 100 is normally allowed to float electrically.

The electrodes 110, 112 and 114 may consist of for example molybdenum or aluminum.

Figure 6:
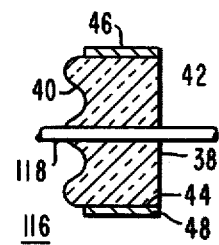
FIG. 6 is a side view of a modified side member suitable for use with the case member of FIG. 1.

With reference to FIG. 6, there is shown another embodiment of a side member 116 suitable for use in forming the case member 10 of FIG. 1. The side member 116 is similar to side member 16 shown in FIG. 1 and all like features are denoted by the same reference numerals used to describe side member 16.

When using a semiconductor device having three regions to which it is necessary to make electrical contact, as for example the transistor 76 of FIG. 4 or the four region switch of FIG. 5, in accordance with the teachings of this invention, a metallic electrical contacting means 118 as for example an aluminum tube, can be formed in the ceramic wall of the side member to facilitate making contact to the third region.

It is obvious, of course, that if more than one three region device is used in practicing the present invention, a side wall member containing the necessary number of metallic electrical contacting means will be employed.

Figure 7:
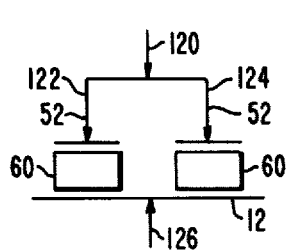
FIG. 7 is a force diagram.

With reference to FIG. 7, the teachings of the present invention is shown schematically in a simplified form.

Two diodes of the type denoted as 60 in FIG. 3 are disposed within the case member 10 of FIG. 1. A single compressive force 120 is exerted against the case. The single compressive force 120 is distributed by pole portions 52 into two compressive forces 122 and 124. The two forces 122 and 124 force the diodes 60 against bottom member 12 which, since bottom member 12 is joined to top member 14 by side member 16, presses back against the diode 60. This force is denoted as 126. The resultant effort is that the diodes 60 are held in electrical and thermal contact with the bottom member 12 and the pole portions 52.

Figure 8:
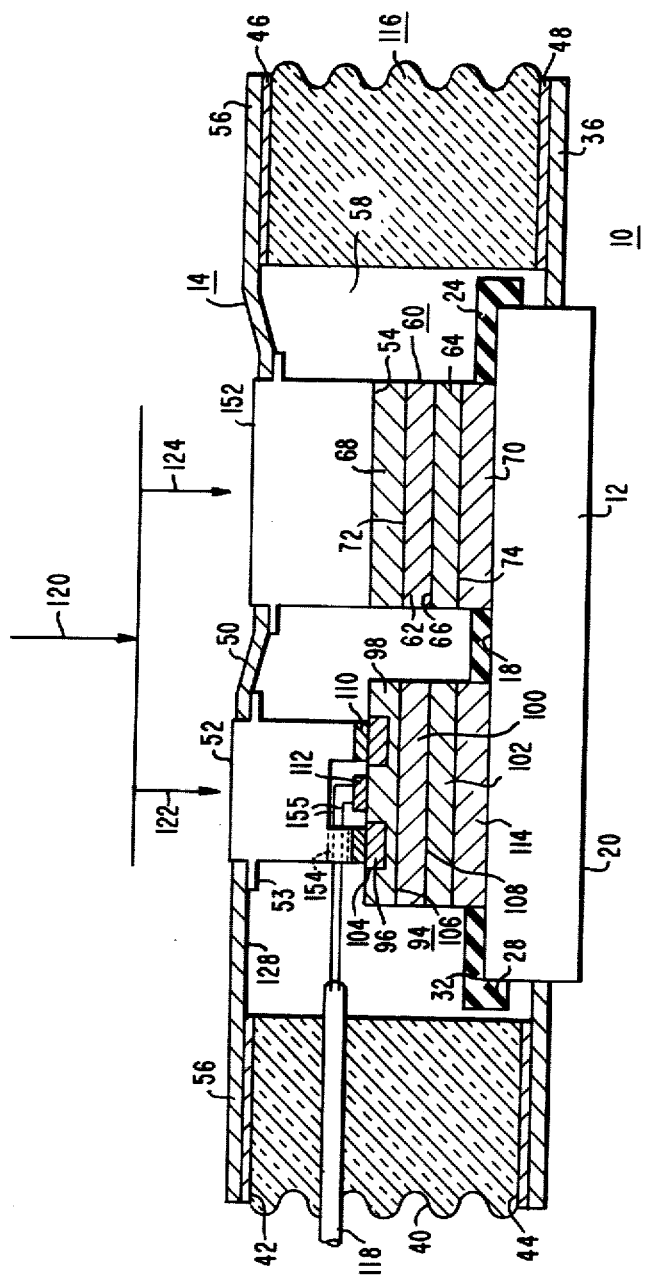
FIG. 8 is a side view of an embodiment of the present invention.

With reference to FIG. 8, there is shown a complete embodiment of the present invention.

The embodiment of FIG. 8, includes the modified case 10 of FIG. 1 comprised of bottom member 12, top member 14 and side member 116 of FIG. 6. All parts of the case in FIG. 8 having the same numerical designation used in describing FIGS. 1 and 6.

Bottom member 12 of modified case 10 is joined to the side member 116 by soldering, brazing or welding flange portion 36 of bottom member 12 to metalized layer 48 of side member 116.

Top member 14 of modified case 10 is joined to the side member 116 by soldering brazing or welding outer portion 56 of plate portion 50 of top member 14 to metalized layer 46 of side member 116.

The resultant structure forms a hermetically sealed chamber 58 bounded by bottom member 12, top member 14 and side member 116.

Positioning means 24, in this embodiment, an electrically insulating cap of polytetrafluoroethylene having a thickness of 0.5 mm, is positioned on surface 18 of bottom member 12 within chamber 58. The insulating cap is of such a size and physical shape as to fit tightly over edge 32 of bottom member 12.

The electrically insulating cap comprising means 24 has a plurality of apertures therein extending vertically entirely through the cap. The apertures are positioned in the cap where it is desired to position semiconductor devices on surface 18 of bottom member 12. The apertures are of such a size and shape as to securely retain the semiconductor device positioned therein and prevent any lateral movement of the device.

In the embodiment shown in FIG. 8, two semiconductor devices are shown enclosed within the chamber 58.

One device is a diode or rectifier of the type shown in FIG. 3 and designated as 60 in both FIGS. 3 and 8. Accordingly, the same numerals are used to designate the same features in both FIGS. 3 and 8.

The diode or rectifier 60, has two molybdenum electrodes 68 and 70 circular in configuration with a diameter of 0.2 to 3.0 cm. Each of the electrodes 68 and 70 is 1.5 m.m. thick. One of the electrodes 68 or 70 may be aluminum. If so, the aluminum electrode will have a thickness of about 0.6 to 6 micrometers.

The thickness of the body of semiconductor material, in this case silicon, comprised of regions 62 and 64 is from 0.25 to 0.75 mm. The body is circular in configuration with a diameter of from 0.2 to 3.0 cm.

The total thickness of the diode or rectifier 60 is then, allowing for solder joints between the two electrodes and the body of semiconductor material approximately 1.5 to 2.0 millimeters.

The other device is a thyristor of the type shown in FIG. 5 and designated as 94 in both FIG. 5 and FIG. 8. Accordingly, the same numerals are used to designate the same features in both FIGS. 5 and 8.

The thyristor 94 as electrode 114 circular in configuration with a diameter of 0.6 to 3.0 cm. The electrode 114 has a thickness of 1.5 mm.

The body of silicon comprised of the four regions 96, 98, 100 and 102 has a thickness of 0.25 to 0.75 mm. The body is circular in configuration with a diameter of 0.2 to 3.0 cm.

Emitter electrode 110 of aluminum has a thickness of 0.5 to 5 micrometers.

Electrode 112, functioning as a gate electrode has a thickness of 0.5 to 6 micrometers.

Thickness of thyristor 94 including electrode 114 and electrode 110, and allowing for thickness of solder joints between electrodes 114 and 110 is approximately 2.0 to 3.0 mm.

Pole portions 52 have a length of 0.5 to 1.5 cm.

The distance between surface 18 of bottom member 12 and surface 128 of plate portion 50 is 0.75 to 1.5 cm.

Therefore, when compressive force 120 is applied pole portion 52 must be moved downward from 0 to 0.5 mm by force 122 to establish electrical and thermal contact with electrode 110.

Pole portion 152 must be moved downward from 0 to 0.5 mm by force 124 to establish electrical and thermal contact with electrode 68.

When plate portion 50 is of copper and has a thickness of 20 mils and force 120 is from 500 pounds to 5000 pounds the necessary downward movement is realized and the desired electrical and thermal contact is established.

It is obvious of course that pole portions of different lengths can be used thus reducing or eliminating entirely any problems resulting from employing semiconductor devices of different thicknesses.

It is obvious of course that the compressive force 120 also establishes electrical and thermal contact between the semiconductors 60 and 94 and bottom member 12 of the case 10.

Since device 94 is a thyristor, electrical contact 154, electrically connected to electrode 112, passes through an aperture 154 in pole 52 and is electrically connected, as for example by crimping, to metallic electrical contacting means 118 in side member 116.

The present invention is particularly suitable when two or three semiconductor devices are to be enclosed within the same case member. However, if four or more devices are enclosed within the case consideration must be given to the arrangement of the devices within the case to ensure that the compression force is able to bear on all the bellows.

Figure 9:
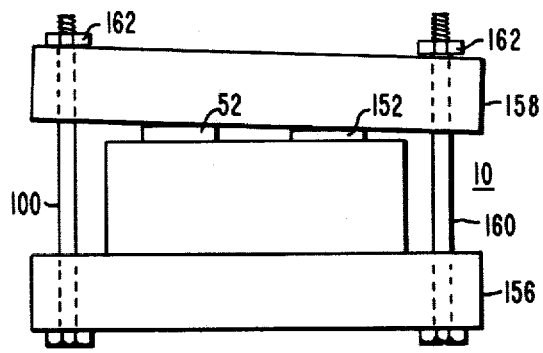
FIG. 9 is a schematic view of the embodiment of FIG. 8 being subjected to a compressive force in accordance with the teachings of the present invention.

With reference to FIG. 9, there is shown one method or applying the compressive force 120 to the case member 10. In FIG. 9, the case member 10 is shown only in block form without the details set forth in FIGS. 1, 6, and 8.

Case member 10 is disposed between a first bar member 156 and a second bar member 158. The two bar members 156 and 158 are drawn together by tightening two bolts 160 with two nuts 162. The tightening of the two nuts 162 causes a compressive force to be exerted against pole portions 52 and 152.

Figure 10:
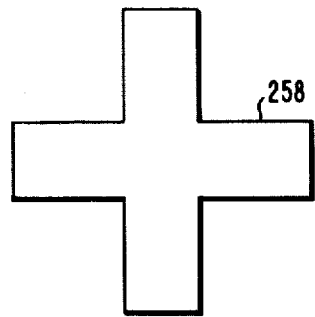
FIG. 10 is a top view of a member suitable for applying a compressive force to the case member of FIG. 1.

If three or four devices are enclosed within the case member 10, at least the top bar member 158 in FIG. 9, can have a cruciform structure and be made preferably of spring steel as shown in FIG. 10 and designated 258. Two or four bolts may be used with bar 258 depending on the shape of the other bar.

The bars may be of a suitable metal or alloy, as for example steel, and may be coated with a cured resin, as for example a silicon resin, polytrifluoromonchloroethylene resin and epoxy resin, if desired.

The present invention lends itself readily to the formation of electronic devices comprised of two discrete semiconductor devices connected electrically in a parallel or antiparallel circuit relationship.

Figure 11:
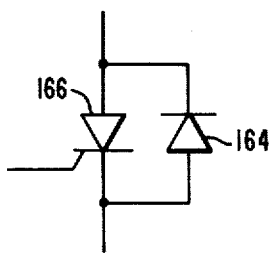
FIGS. 11 and 12 are schematic circuit diagrams.

Specifically, many power circuit utilize a rectifier 164 electrically connected in an antiparallel circuit relationship with a thyristor 166 as shown in FIG. 11.

By utilizing the teachings of the present invention, the rectifier and thyristor may be enclosed within the same case member.

Figure 12:
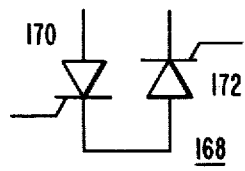

With reference to FIG. 12, another utilization of the present invention provides a method for forming a triac 168 by enclosing two thyristors 170 and 172 in an electrical circuit antiparallel relationship within the same case member.

Those skilled in the art will realize a myriad of other ways to utilize the present invention.

We claim as our invention:

1. An electronic device comprising:
   (a) a case member, said case member comprising a bottom member, a top member and a side member, said side member being joined to and extending between said bottom member and said top member, said bottom member, top member and side member forming a chamber, said top member of said case being comprised of a plate portion and pole portions,
   (b) means associated with a surface of said bottom member disposed within said chamber for positioning a plurality of semiconductor devices upon said surface,
   (c) a plurality of semiconductor devices disposed in predetermined positions upon the surface of said bottom member within said chamber,
   (d) means comprising said pole portions of said top member distributing a compressive force, applied to said case member, to each of said plurality of semiconductor devices, there being a pole portion for each device, whereby said semiconductor devices are held in an electrical and thermal conductive relationship with portions of said case member and in an electrical circuit relationship with each other when the compressive force is applied to said case member.

2. The invention of claim 1 in which the means associated with a surface of said bottom member disposed within said chamber for positioning a plurality of semiconductor devices upon said surface is a cap of an electrically insulating material disposed upon said surface, walls of said insulating material forming a plurality of apertures therein extending entirely therethrough.

3. The invention of claim 1 in which the means associated with a surface of said bottom member disposed within said chamber for positioning a plurality of semiconductor devices upon said surface is a plurality of cavities formed within said surface.

4. The invention of claim 1 in which said pole portions are electrically insulated from the remainder of said top member of said case member.

5. The invention of claim 1 in which two semiconductor devices are disposed in a predetermined position upon said surface of said bottom member within said chamber.

6. The invention of claim 5 in which one semiconductor device is a diode and the other semiconductor device is a thyristor.

7. The invention of claim 6 in which the diode and thyristor are in an antiparallel electrical circuit relationship.

8. The invention of claim 5 in which both semiconductor devices are thyristors in an antiparallel electrical circuit relationship.

* * * * *